United States Patent
Li et al.

(10) Patent No.: US 9,478,463 B2
(45) Date of Patent: Oct. 25, 2016

(54) DEVICE AND METHOD FOR IMPROVING RF PERFORMANCE (71) Applicant: SEMICONDUCTOR MANUFACTURING INTERNATIONAL (SHANGHAI) CORPORATION, Shanghai (CN)

(72) Inventors: Haiting Li, Shanghai (CN); Herb He Huang, Shanghai (CN); Qiang Zhou, Shanghai (CN); Hongtao Ge, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/800,650

(22) Filed: Jul. 15, 2015

(65) Prior Publication Data
US 2016/0027665 A1   Jan. 28, 2016

(30) Foreign Application Priority Data

Jul. 28, 2014 (CN) .......................... 2014 1 0362418

(51) Int. Cl.
*H01L 29/80* (2006.01)
*H01L 21/768* (2006.01)
(Continued)

(52) U.S. Cl.
CPC ......... *H01L 21/76898* (2013.01); *H01L 21/84* (2013.01); *H01L 23/13* (2013.01); *H01L 23/481* (2013.01); *H01L 23/5227* (2013.01); *H01L 23/66* (2013.01); *H01L 24/94* (2013.01); *H01L 27/1203* (2013.01); *H01L 23/20* (2013.01); *H01L 23/3171* (2013.01); *H01L 24/05* (2013.01); *H01L 28/10* (2013.01); *H01L 2223/6611* (2013.01); *H01L 2223/6616* (2013.01); *H01L 2223/6644* (2013.01); *H01L 2224/04042* (2013.01); *H01L 2224/0557* (2013.01); *H01L 2224/05568* (2013.01); *H01L 2224/05624* (2013.01); *H01L 2224/05647* (2013.01); *H01L 2224/32225* (2013.01); *H01L 2224/94* (2013.01); *H01L 2924/14* (2013.01); *H01L 2924/1421* (2013.01);
(Continued)

(58) Field of Classification Search
CPC ................ H01L 27/1203; H01L 21/76898; H01L 23/481; H01L 24/94; H01L 28/10
USPC ........................................................ 257/275
See application file for complete search history.

(56) References Cited

U.S. PATENT DOCUMENTS

| | | | | |
|---|---|---|---|---|
| 6,815,739 | B2 * | 11/2004 | Huff | B81B 7/0064 257/275 |
| 6,909,589 | B2 * | 6/2005 | Huff | H01G 5/014 361/278 |
| 2015/0329351 | A1 * | 11/2015 | Cheng | B81B 7/007 257/417 |

*Primary Examiner* — Luan C Thai
(74) *Attorney, Agent, or Firm* — Kilpatrick Townsend and Stockton LLP (57) ABSTRACT

A semiconductor device and method of fabricating the semiconductor device are provided. The semiconductor device includes a first substrate including a front-end device containing a transistor, a radio frequency (RF) device and a first interconnect structure, and a second substrate containing a cavity disposed at a location corresponding to a location of the RF device. The first substrate and the second substrate are bonded together such that the first surface of the first substrate is facing the cavity in the second substrate, and the cavity is over the RF device. Because of the cavity, the distance between the second substrate and the RF device is relatively large so that the second substrate has less impact on the performance of the RF device, thereby improving the performance of the semiconductor device.

18 Claims, 7 Drawing Sheets

(51) Int. Cl.
*H01L 23/66* (2006.01)
*H01L 23/48* (2006.01)
*H01L 23/00* (2006.01)
*H01L 21/84* (2006.01)
*H01L 27/12* (2006.01)
*H01L 23/13* (2006.01)
*H01L 23/522* (2006.01)
*H01L 49/02* (2006.01)
*H01L 23/31* (2006.01)
*H01L 23/20* (2006.01)

(52) U.S. Cl.
CPC .................... *H01L 2924/157* (2013.01); *H01L 2924/15159* (2013.01)

DEVICE AND METHOD FOR IMPROVING RF PERFORMANCE

CROSS-REFERENCES TO RELATED APPLICATIONS

This application claims priority to Chinese patent application No. 201410362418.7, filed on Jul. 28, 2014, the content of which is incorporated herein by reference in its entirety.

BACKGROUND OF THE INVENTION

The present invention relates to a semiconductor structure and method of manufacture, and more particularly to an RF device and manufacturing method thereof.

With the increase in operating frequency and high integration density, the types of substrate materials have a growing impact on circuit performance. Silicon on insulator (SOI) wafers have been widely used in RF circuit devices because of their good electrical characteristics and compatibility with CMOS process techniques.

Figure 1:
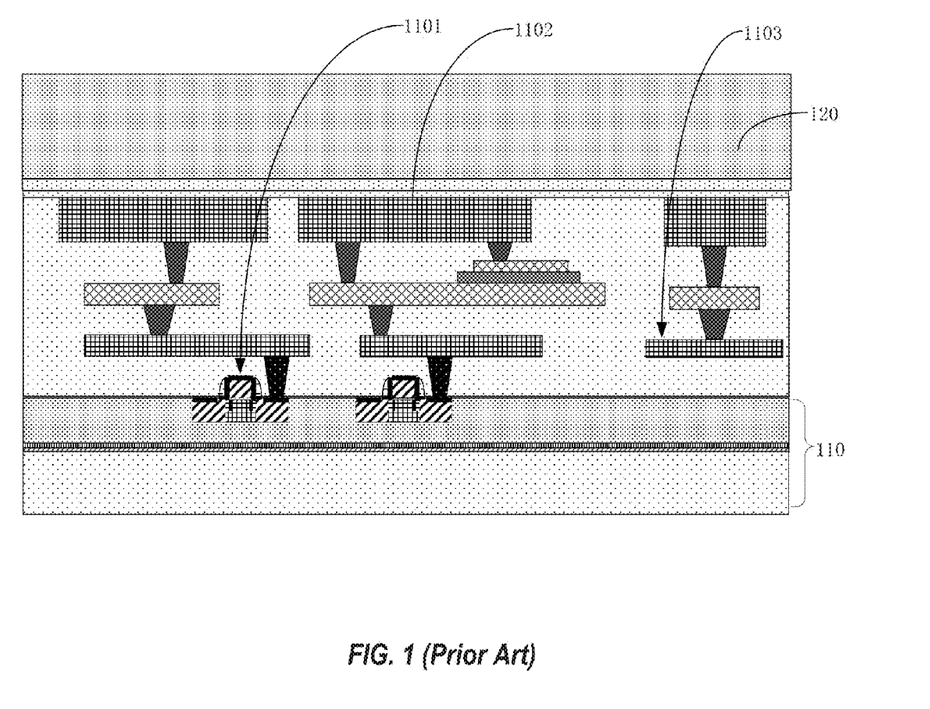
FIG. 1 is a cross-sectional view illustrating a semiconductor device structure according to the prior art.

Conventional techniques for manufacturing a semiconductor device using double-sided thin SOI processes may include: forming a first transistor 1101, a radio frequency (RF) device 1102 (e.g., an inductor) and an interconnect structure 1103 on an SOI substrate 110; forming a carrier wafer 120 on the side of SOI substrate 110 that includes RF device 1102, as shown in FIG. 1. The close proximity of carrier wafer relative to RF device 1102 will negatively affect the performance of the semiconductor device. Such semiconductor device structures may not meet the actual requirements in certain RF applications.

Therefore, there is a needed for a novel semiconductor device structure and method for manufacturing the same.

BRIEF SUMMARY OF THE INVENTION

Embodiments of the present invention provide a semiconductor device including a first substrate having a first surface and a second surface opposite the first surface, the first substrate containing a front-end device disposed on the first surface, the front-end device includes a transistor, a radio frequency (RF) device and a first interconnect structure; and a second substrate comprising a cavity disposed at a location corresponding to a location of the RF device. The first substrate and the second substrate are bonded together such that the first surface of the first substrate is facing the cavity in the second substrate, and the cavity is over the RF device.

In one embodiment, the first substrate is a silicon on insulator substrate.

In one embodiment, the RF device has a top surface disposed in the cavity. The RF device may include an inductor.

In one embodiment, the cavity is a vacuum chamber or a cavity filled with a gas.

In one embodiment, the semiconductor device may also include a second interconnect structure extending through the first substrate and connected to the first interconnect structure, and a pad disposed on a second surface opposite the first surface of the first substrate and connected to the second interconnect structure.

In one embodiment, the semiconductor device may further include a passivation layer that covers the second surface of the first substrate and exposes a bonding region of the pad.

In one embodiment, the second interconnect structure includes a through-silicon via.

Embodiments of the present invention also provide a method for manufacturing a semiconductor device. The method includes: providing a first substrate having a first surface and a second surface opposite the first surface, the first substrate comprising a front-end device disposed on the first surface, the front-end device comprising a transistor, a radio frequency (RF) device and a first interconnect structure. The method also includes providing a second substrate, forming a cavity in the second substrate at a location corresponding to a location of the RF device, bonding the first substrate and the second substrate together such that the first surface of the first substrate is facing the cavity in the second substrate, and the cavity is over the RF device, and performing a thinning process on the second surface of the first substrate.

In one embodiment, forming the cavity may include forming a patterned mask layer having an opening at a location corresponding to a location of the RF device, and etching the second substrate using the patterned mask layer as a mask.

In one embodiment, performing the thinning process comprises a chemical mechanical polishing process.

In one embodiment, the method may further include forming a second interconnect structure extending through the first interconnect structure, the second interconnect structure connected to the first interconnect structure, and forming a pad on the second surface of the first substrate, the pad connected to the second interconnect structure.

In one embodiment, the method may also include forming a passivation layer covering the second surface of the first substrate and exposing a portion of a surface of the pad.

Embodiments of the present invention also provide an electronic device including an electronic component and a semiconductor device connected to the electronic component. The semiconductor device includes: a first substrate having a first surface and a second surface opposite the first surface, the first substrate comprising a front-end device disposed on the first surface, the front-end device comprising a transistor, a radio frequency (RF) device and a first interconnect structure, and a second substrate comprising a cavity disposed at a location corresponding to a location of the RF device. The first substrate and the second substrate are bonded together such that the first surface of the first substrate is facing the cavity in the second substrate, and the cavity is over the RF device.

The following description, together with the accompanying drawings, will provide a better understanding of the nature and advantages of the claimed invention.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

The term "vertical" as used in this application is defined as a plane perpendicular to the conventional plane or surface of a wafer or substrate, regardless of the orientation of the wafer or substrate. The term "horizontal" refers to a direction perpendicular to the vertical as defined above.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The present invention will now be described more fully herein after with reference to the accompanying drawings, in which preferred embodiments of the invention are shown. This invention may, however, be embodied in many different forms and should not be construed as limited by the embodiments set forth herein. Rather, these embodiments are provided so that this disclosure will be thorough and complete, and will fully convey the scope of the invention to those skilled in the art.

Embodiment 1

Embodiments of the present invention provide a semiconductor device that is fabricated using double-sided thin SOI processes. The semiconductor device may include an integrated circuit or an intermediate product that contain a radio frequency (RF) device. As used herein, the term "first surface" is referred to as the side of the substrate where one or more components and/or layers are formed thereon. The opposite surface is referred to as the "second surface."

Figure 2:
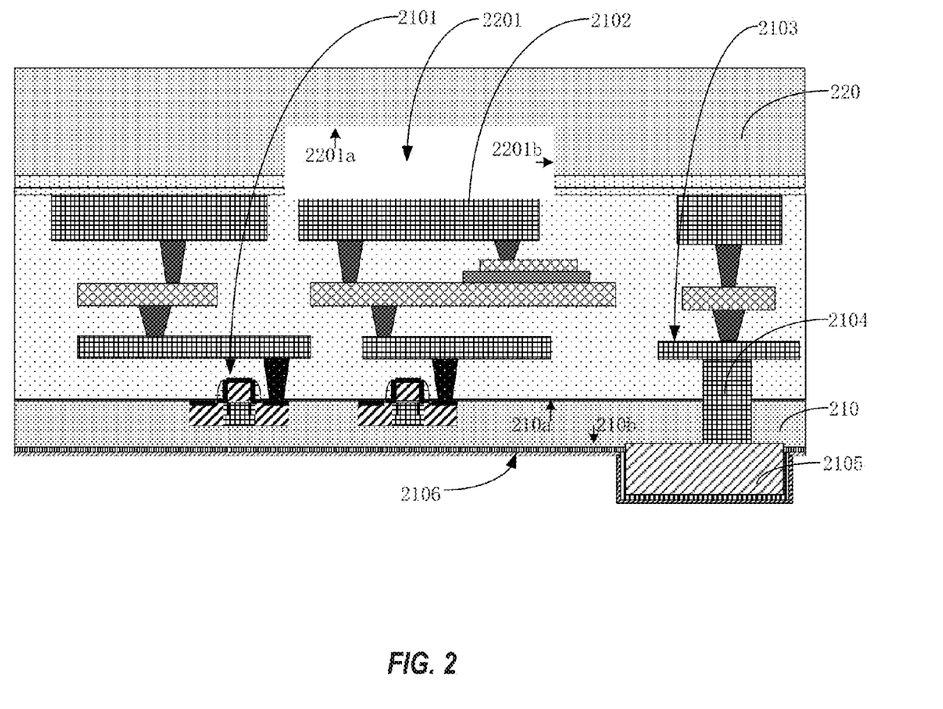
FIG. 2 is a cross-sectional view illustrating a semiconductor device structure according to an embodiment of the present invention.

FIG. 2 is a cross-sectional view of a semiconductor device according to an embodiment of the present invention. As shown in FIG. 2, the semiconductor device includes a first substrate 210 having a first surface 210*a* and a second surface 210*b*, a front-end device on the first surface including a transistor 2101, a RF device 2102 and an interconnect structure 2103. The semiconductor device includes a second substrate 220 joined (bonded) to first substrate on the side of the front-end device. Second substrate 220 includes a cavity 2102 formed at a location above RF device 2102.

In an embodiment, first substrate 210 is a silicon on insulator (SOI) substrate, and more particularly first substrate 210 is an SOI substrate after a thinning process.

In the embodiment, transistor 2101 is configured to form a variety of electronic circuits, RF device 2102 is configured to form an RF component or module, first interconnect structure 2103 is configured to connect transistor 2101 and components of the RF front-end device. RF device 2102 may include an inductor.

The front-end device may also include a variety of components such as resistors, capacitors, MEMS devices and others. Transistor 2101, RF device 2102, and first interconnect structure 2103 and other components can be formed using conventional manufacturing processes known to those of skill in the art and will not be described herein for the sake of brevity.

Second substrate 220 is a carrier wafer for carrying and protecting the front-end device of first substrate 210. Second substrate 220 may be a common silicon substrate or other suitable substrates. In an embodiment, second substrate 220 and first substrate 210 are bonded together using wafer bonding technology.

In an embodiment, cavity 2201 includes a top surface 2201a, sidewalls 2201b formed in second substrate 220 and a dielectric layer 230 on first substrate 210, and the opening of cavity 2201 is facing RF device 2102, i.e., RF device 2102 has a top portion disposing within cavity 2201, as shown in FIG. 2. Furthermore, cavity 2201 may be entirely located within second substrate 220, i.e., the bottom surface, the top surface and the sidewalls of cavity 2201 are within second substrate 220. Cavity 2201 may be a vacuum chamber or a cavity filled with a gas.

In the embodiment, the semiconductor device may further include a second interconnect structure 2104 extending through first substrate 210 to connect to first interconnect structure 2103, and a pad 2105 on the second surface 210b (facing away from second substrate 220) of first substrate 210 and configured to connect to second interconnect structure 2104, as shown in FIG. 2. Pad 2105 is used to provide a signal or power source to the inside of the semiconductor device through second interconnect structure 2104 and first interconnect structure 2103. Pad 2105 may be made of aluminum or other suitable metals. The semiconductor device may further include a passivation layer 2106 covering the second surface 210b of first substrate 210 and exposing a bonding region (not shown) of pad 2105, as shown in FIG. 2. It is noted that the exposed bonding region of pad 2105 is not shown in the cross-sectional view of the semiconductor device. Passivation layer 2106 is configured to protect first substrate 210 and pad 2105.

In the embodiment, first interconnect structure 2103 may include a metal layer (e.g., a copper layer or an aluminum layer), a metal plug, etc. Second interconnect structure 2104 may be a through-silicon vias or other suitable structures. Passivation layer 2106 may include silicon nitride or other suitable materials.

In the embodiment, because second substrate (carrier wafer) 220 has a cavity disposed at the location above RF device 2102, the distance between second substrate 220 and RF device 2102 is relatively large so that the effect of second substrate 220 on RF device 2102 is reduced, thereby improving the performance of the semiconductor device.

In accordance with the present invention, the semiconductor device may be an RF front-end module or other RF circuits and RF modules. Because of the improved RF performance the semiconductor device may satisfy the requirements of many special applications.

Embodiment 2

FIGS. 3A to 3D are simplified cross-sectional views illustrating stages of process steps of forming a semiconductor device according to an embodiment of the present invention. FIG. 4 is a simplified flow chart of a method for fabricating a semiconductor device according to an embodiment of the present invention.

Figure 3A:
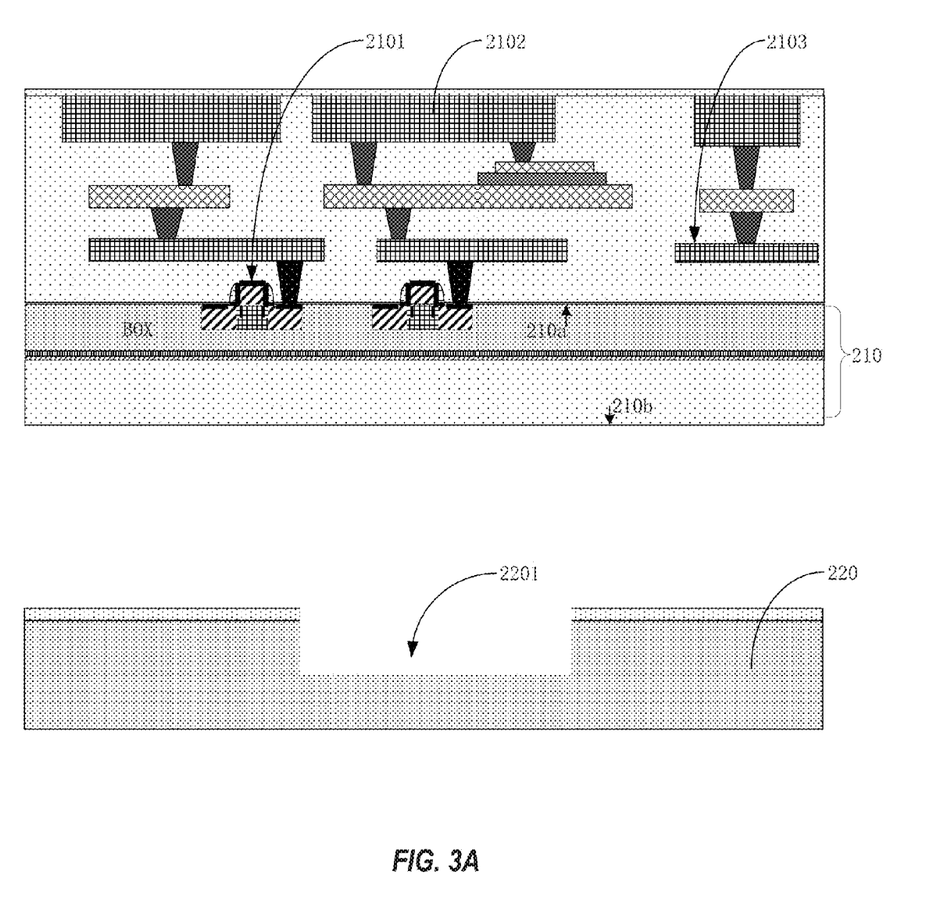
FIGS. 3A to 3D are cross-sectional views depicting stages of a method of manufacturing a semiconductor device according to an embodiment of the present invention.
Figure 4:
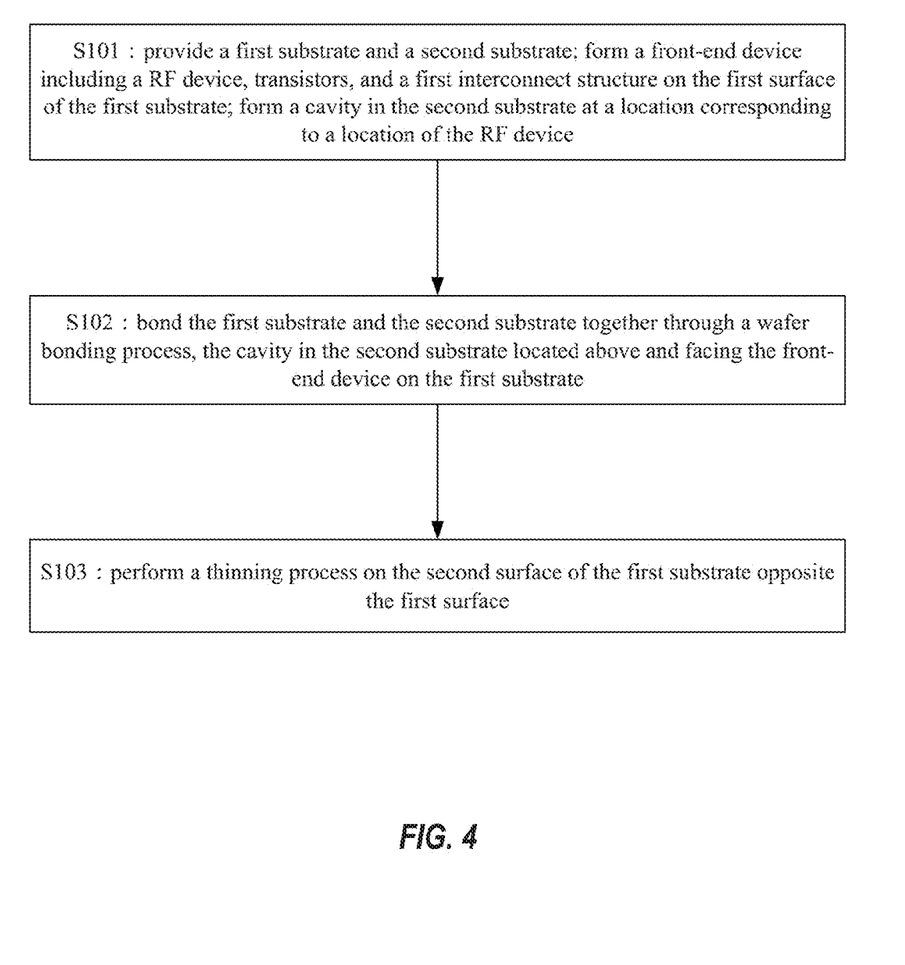
FIG. 4 is a simplified flow chart of a method for manufacturing a semiconductor device according to an embodiment of the present invention.

With reference to FIGS. 3A-3D and FIG. 4, a method for fabricating a semiconductor device may include the following steps:

Step A1: providing a first substrate 210 having a first surface 210a and a second surface 210b; and forming a front-end device comprising a transistor 2101, an RF device 2102 and a first interconnect structure 2103 on first surface 210a, as shown in FIG. 3A.

Step A1 also includes providing a second substrate 220, and forming a cavity 2201 in second substrate 220, cavity 2201 is disposed at the location corresponding to the location of RF device 2102, as shown in FIG. 3A.

The steps of forming the front-end device on first substrate 210 and forming cavity 2201 in second substrate 220 can be performed at the same time (concurrently) or sequentially in any arbitrary order depending upon manufacturing requirements.

In the embodiment, first substrate 210 may be a silicon on insulator (SOI) substrate. In an exemplary embodiment, the front-end device is disposed on the same side of the insulator layer (e.g., over the buried oxide (BOX) layer).

In the embodiment, transistor 2101 is configured to form a variety of circuits. RF device 2102 is configured to form a RF component or module. First interconnect structure 2103 is configured to connect transistor 2101, RF device 2012 and other components of the front-end device. Transistor 2101 can be any conventional transistors, high-k metal gate transistors, fin-type transistors, or other suitable transistors. First interconnect structure 2103 may include a metal layer (e.g., a copper layer or an aluminum layer), a metal plug and the like. RF device 2102 may include an inductor and other devices.

In addition to transistor 2101, RF device 2012 and first interconnect structure 2103, the front-end device may also include a variety of other components, such as resistors, capacitors, MEMS devices, etc. Components and structures of the front-end device may be formed using conventional process techniques known to those skilled in the art and will not be described herein for the sake of brevity.

In the embodiment, second substrate 220 is configured to be a carrier substrate (carrier wafer) to carry and protect first substrate 210 in subsequent thinning process and other processes. Second substrate 220 may be a common silicon substrate or other suitable substrate.

Cavity 2201 can be formed in second substrate 220 at the location corresponding to the location of RF device 2201 may be formed using the following steps: forming a patterned mask layer having an opening corresponding to the location of RF device 2102, and etching second substrate 220 using the patterned mask layer as a mask to form cavity 2201.

The patterned mask layer may be a photoresist layer formed using photolithographic process. Second substrate 220 can be etched using dry etching, wet etching or other suitable etching processes.

Figure 3B:
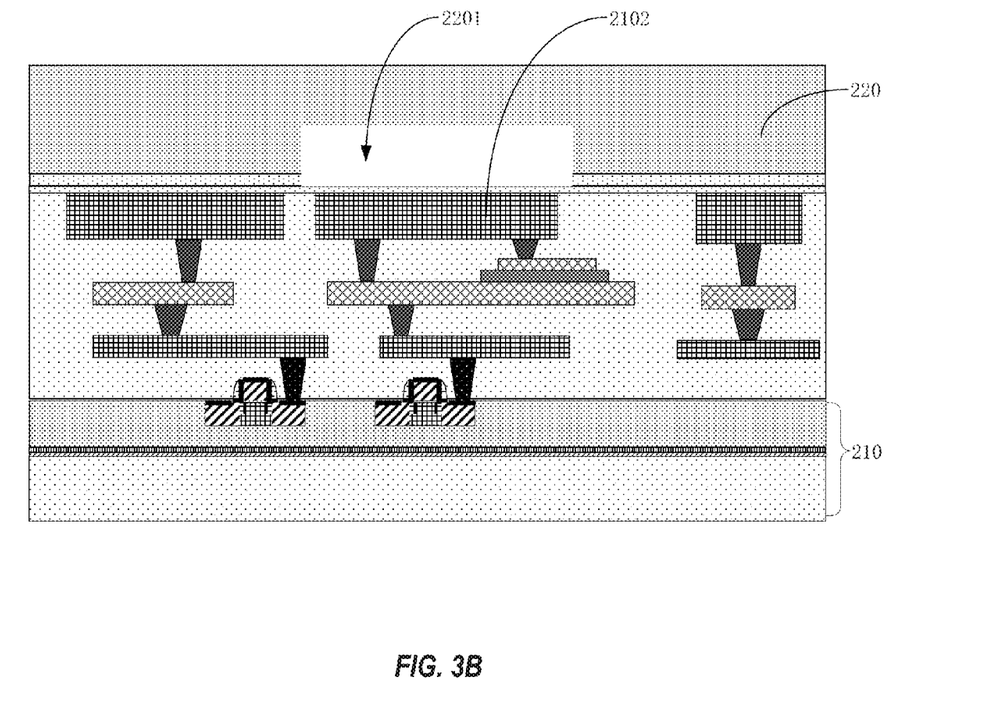

Step A2: bonding second substrate 220 and first substrate 210 together using a wafer bonding process, where cavity 2201 is facing the front-end device disposed on the first surface of first substrate 210, as shown in FIG. 3B.

Second substrate 220 is disposed over the front-end device after bonding. Since cavity 2201 is formed in second substrate 220 and disposed at a location corresponding to the location of RF device 2102, cavity 2201 is thus located over RF device 2101 after first and second substrates 210, 220 are bonded together, as shown in FIG. 3B.

Figure 3C:
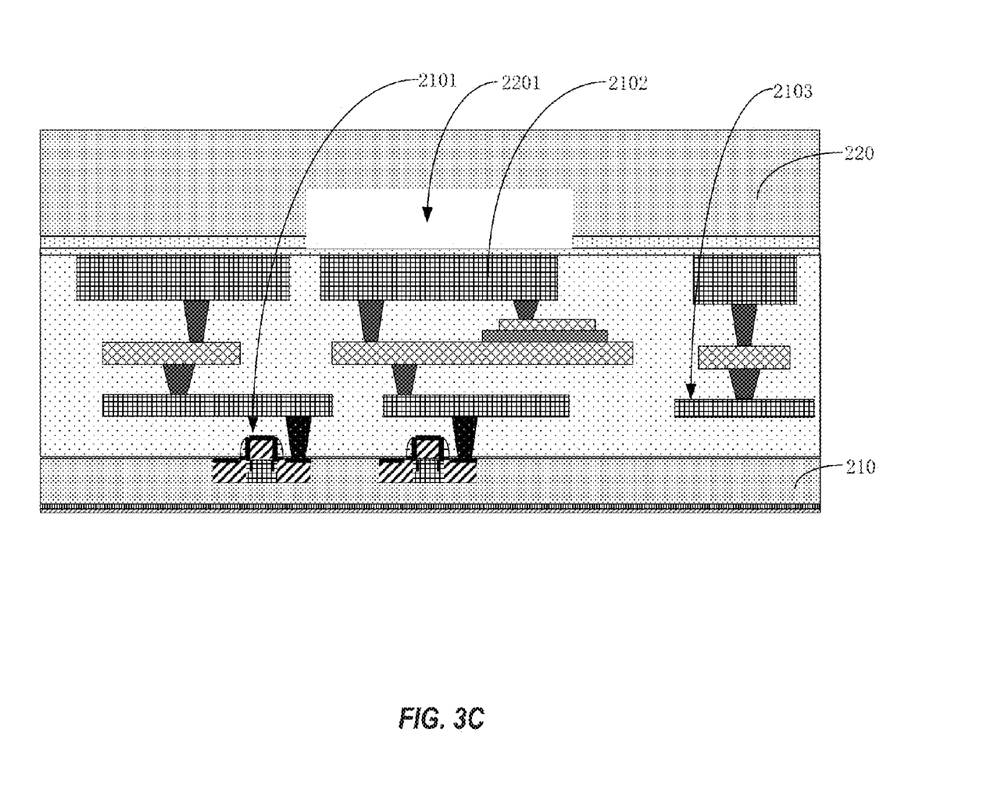

Step A3: performing a thinning process on the second surface 210b of first substrate 210, the second surface is opposite the first surface where the RF device is formed, as shown in FIG. 3C.

In a specific embodiment, first substrate 210 is an SOI substrate, the thinning process is stopped at the buried insulating layer of the SOI substrate. The thinning process may be a chemical mechanical polishing (CMP) process or other suitable processes.

This completes the manufacturing processes of the structure of a semiconductor device. A double-sided thin SOI structure is formed through steps A1 through A3. Thereafter, the semiconductor device structure may further be processed using conventional process techniques to finalize the semiconductor device.

Figure 3D:
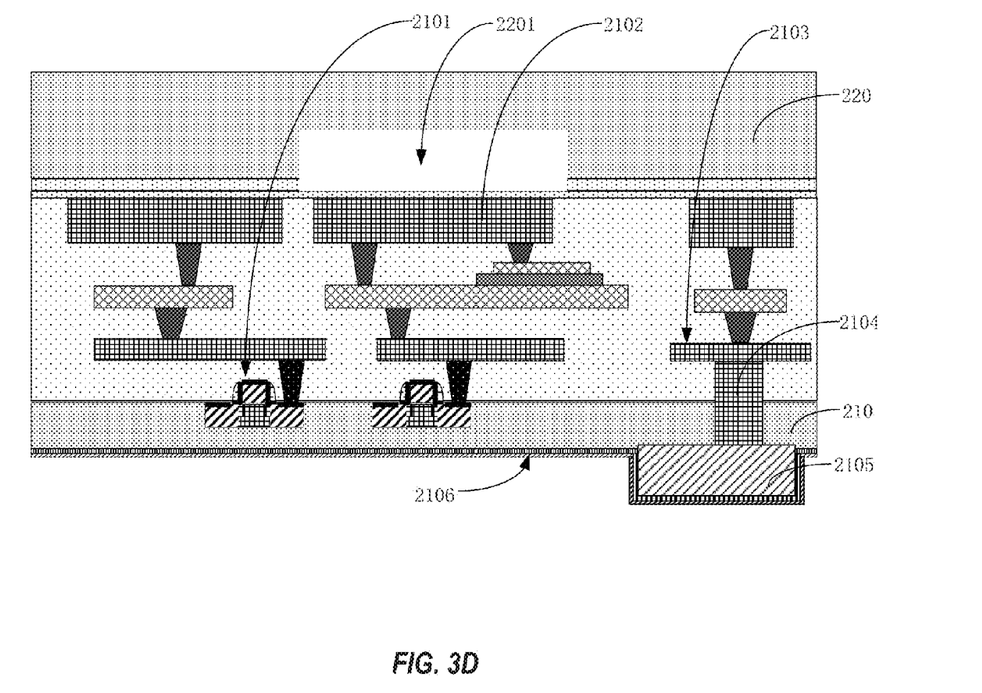

In some embodiments, after step A3, the method for fabricating the semiconductor device may include the following steps:

Step A4: forming a second interconnect structure 2104 extending through first substrate 210 to connect to first interconnect structure 2103; and forming a pad 2105 on the second surface of first substrate 210 to connect to second interconnect structure 2104, as shown in FIG. 3D. Additionally, the method also includes forming a passivation layer 2106 covering the second surface of first substrate 210 and exposing a portion of the surface of pad 2105, as shown in FIG. 3D. The exposed portion of pad 2105 is a bonding region configured for wire-bonding (not shown in FIG. 3D).

Second interconnect structure 2104 is configured to connect first interconnect structure 2103 to an external device (not shown). Second interconnect structure 2104 may be a through-silicon via or other suitable structures. Second interconnect structure 2104 may also include copper or other suitable conductive materials.

Pad 2105 is configured to provide a signal or a power source to the inside of the semiconductor device through second interconnect structure 2104 and first interconnect structure 2103. Pad 2105 may be made of aluminum, copper or other suitable conductive materials.

In accordance with the present invention, the cavity in the second substrate of the semiconductor device manufactured using the above-described method is located above the RF device in the first substrate so that the second substrate is disposed at a relatively great distance from the RF device, and thus has less impact on the RF device, thereby improving the overall performance of the semiconductor device.

FIG. 4 is a simplified flow chart of a method for manufacturing a semiconductor device according to an embodiment of the present invention. The method includes the following steps:

Step S101: provide a first substrate and a second substrate, the first substrate having a first surface and a second surface opposite the first surface; form a front-end device including a RF device, a transistor, and a first interconnect structure on the first surface of the first substrate; and form a cavity in the second substrate at a location corresponding to a location of the RF device;

Step 102: bond the first substrate and the second substrate together through a wafer bonding process, the cavity in the second substrate is located above and facing the front-end device on the first substrate; and Step 103: perform a thinning process on the second surface of the first substrate.

Embodiment 3

Embodiments of the present invention provide an electronic device including an electronic component and a semiconductor device connected to the electronic component. The semiconductor device can be the semiconductor device of embodiment 1 or manufactured by the above-described method of embodiment 2. The semiconductor device includes a first substrate having a first surface and a second surface and a second substrate. The first surface of the first substrate is brought together with the surface of the second substrate having the cavity using a wafer bonding technique. The first substrate has a front-end device disposed on the first surface and facing the cavity of the second substrate.

In accordance with the present invention, the electronic device may be a mobile phone, a laptop computer, a netbook, a tablet PC, a game console, a TV, a DVD player, a GPS device, a camera, a voice recorder, MP3, MP4, PSP players, and other semiconductor devices including intermediate products and electronic components that are manufactured using the above-described method to improve RF performance.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A semiconductor device comprising:
  a first silicon-on-insulator (SOI) substrate having a first surface and a second surface opposite the first surface, the first substrate comprising a front-end device disposed on the first surface, the front-end device comprising a transistor, a radio frequency (RF) device and a first interconnect structure; and
  a second substrate comprising a cavity disposed at a location corresponding to a location of the RF device;
  wherein:
  the first SOI substrate and the second substrate are bonded together such that the first surface of the first SOI substrate is facing the cavity in the second substrate, and the cavity is over the RF device,
  the second surface of the first SOI substrate comprises a buried insulating layer, and
  a passivation layer on the buried insulating layer of the second surface of the first SOI substrate.

2. The semiconductor device of claim 1, wherein the RF device has a top surface disposed in the cavity.

3. The semiconductor device of claim 1, wherein the cavity is a vacuum chamber or a cavity filled with a gas.

4. The semiconductor device of claim 1, wherein the RF device comprises an inductor.

5. The semiconductor device of claim 1, further comprising:
  a second interconnect structure extending through the first SOI substrate and connected to the first interconnect structure; and a pad disposed on the second surface opposite the first surface of the first SOI substrate, the pad connected to the second interconnect structure.

6. The semiconductor device of claim 5, wherein the passivation layer covers the second surface of the first SOI substrate and exposes a bonding region of the pad.

7. The semiconductor device of claim 5, wherein the second interconnect structure comprises a through-silicon via.

8. A method for manufacturing a semiconductor device, the method comprising:
providing a first silicon-on-insulator (SOI) substrate having a first surface and a second surface opposite the first surface, the first substrate comprising a front-end device disposed on the first surface, the front-end device comprising a transistor, a radio frequency (RF) device and a first interconnect structure;
providing a second substrate;
forming a cavity in the second substrate at a location corresponding to a location of the RF device;
bonding the first substrate and the second substrate together such that the first surface of the first substrate is facing the cavity in the second substrate, and the cavity is over the RF device;
performing a thinning process on the second surface of the first SOI substrate until a buried insulating layer is exposed.

9. The method of claim 8, wherein forming the cavity comprises:
forming a patterned mask layer having an opening at a location corresponding to a location of the RF device; and
etching the second substrate using the patterned mask layer as a mask.

10. The method of claim 8, wherein the RF device comprises an inductor.

11. The method of claim 8, wherein performing the thinning process comprises a chemical mechanical polishing process.

12. The method of claim 8, further comprising:
forming a second interconnect structure extending through the first SOI substrate, the second interconnect structure connected to the first interconnect structure;
forming a pad on the second surface of the first SOI substrate, the pad connected to the second interconnect structure.

13. The method of claim 12, further comprising:
forming a passivation layer covering the buried insulating layer of the first SOI substrate and exposing a portion of a surface of the pad.

14. The method of claim 12, wherein the second interconnect structure comprises a through-silicon via.

15. An electronic device comprising an electronic component and a semiconductor device connected to the electronic component, wherein the semiconductor device comprises:
a first silicon-on-insulator (SOI) substrate having a first surface and a second surface opposite the first surface, the first substrate comprising a front-end device disposed on the first surface, the front-end device comprising a transistor, a radio frequency (RF) device and a first interconnect structure; and
a second substrate comprising a cavity disposed at a location corresponding to a location of the RF device;
wherein:
the first SOI substrate and the second substrate are bonded together such that the first surface of the first substrate is facing the cavity in the second substrate, and the cavity is over the RF device,
the second surface of the first SOI substrate comprises a buried insulating layer, and
a passivation layer on the buried insulating layer of the second surface of the first SOI substrate.

16. The electronic device of claim 15, wherein the semiconductor device further comprises:
a second interconnect structure extending through the first SOI substrate and connected to the first interconnect structure; and
a pad disposed on the second surface opposite the first surface of the first SOI substrate, the pad connected to the second interconnect structure and having a bonding surface exposed by the passivation layer.

17. The electronic device of claim 15, wherein the cavity is a vacuum chamber or a chamber filled with a gas.

18. The electronic device of claim 15, wherein the RF device comprises an inductor.

* * * * *